(12) United States Patent
Chang et al.

(10) Patent No.: US 8,304,837 B2
(45) Date of Patent: Nov. 6, 2012

(54) DIFFERENTIALLY RECESSED CONTACTS FOR MULTI-GATE TRANSISTOR OF SRAM CELL

(75) Inventors: Josephine B. Chang, Mahopac, NY (US); Leland Chang, New York, NY (US); Chung-Hsun Lin, White Plains, NY (US); Jeffrey W. Sleight, Ridgefield, CT (US)

(73) Assignee: International Business Machines Corporation, Armonk, NY (US)

( * ) Notice: Subject to any disclaimer, the term of this patent is extended or adjusted under 35 U.S.C. 154(b) by 146 days.

(21) Appl. No.: 12/816,825

(22) Filed: Jun. 16, 2010

(65) Prior Publication Data

US 2011/0309448 A1     Dec. 22, 2011

(51) Int. Cl.
*H01L 21/70* (2006.01)
(52) U.S. Cl. ................. 257/369; 257/E27.098
(58) Field of Classification Search .......... 257/369, 257/E27.098
See application file for complete search history.

(56) References Cited

U.S. PATENT DOCUMENTS

| 6,563,160 | B2 * | 5/2003 | Clevenger et al. | 257/301 |
| 6,864,519 | B2 * | 3/2005 | Yeo et al. | 257/206 |
| 2004/0099885 | A1 * | 5/2004 | Yeo et al. | 257/208 |
| 2008/0057634 | A1 * | 3/2008 | Lee | 438/156 |
| 2009/0321843 | A1 * | 12/2009 | Waite et al. | 257/369 |

* cited by examiner

*Primary Examiner* — Julio J Maldonado
*Assistant Examiner* — Robert Bachner
(74) *Attorney, Agent, or Firm* — Cantor Colburn LLP; Vazken Alexanian

(57) ABSTRACT

A complementary metal-oxide-semiconductor static random access memory cell that includes a plurality of P-channel multi-gate transistors and a plurality of N-channel multi-gate transistors. Each transistor includes a gate electrode and source and drain regions separated by the at least one gate electrode. The SRAM cell further includes a plurality of contacts formed within the source and drain regions of at least one transistor. A plurality of contacts of at least one transistor are recessed a predetermined recess amount, wherein a resistance of the at least one transistor is varied based upon the predetermined recess amount.

12 Claims, 4 Drawing Sheets

DIFFERENTIALLY RECESSED CONTACTS FOR MULTI-GATE TRANSISTOR OF SRAM CELL

BACKGROUND

The present invention relates to static random access memory (SRAM) devices and more specifically, to differentially recessed contacts to enhance multi-gate field effect transistors (FET) SRAM cell stability.

A typical complementary metal-oxide-semiconductor (CMOS) static random access memory (SRAM) cell consists of six metal-oxide-semiconductor field effect transistors (MOSFETs) including two P-channel field-effect transistors (PFETs) for a pull-up operation, two N-channel field-effect transistors (NFETs) for a pull-down operation, and two NFETs for input/output access (i.e., pass-gate access/access transistors). FIG. 1 is a diagram illustrating a conventional SRAM cell 10. As shown in FIG. 1, the SRAM cell 10 includes two input/output access transistors (NFETs) 12, two pull-down transistors (NFETs) 14, and two pull-up transistors (PFETs) 16. The SRAM cell 10 further includes a plurality of contacts 18 formed on at least one transistor 12, 14, 16. The transistors 12, 14, and 16 include a gate electrode 13 and at least one semiconductor fin 15 formed vertically along a substrate (not shown). A beta ratio of the SRAM cell 10 is defined as the current of the pull-down NFET 14 divided by the current of the access transistor 12. The beta ratio for the conventional multi-gate FET-based SRAM cell 10 is approximately 2.

Today, the multi-gate FET-based SRAM cell has been demonstrated for scaling down in CMOS technology. Conventionally, a multi-gate FET-based SRAM lacks feasibility to have an arbitrary beta ratio due to the fin quantization effect. The beta ratio of planar FET-based SRAM cell, on the other hand, can be arbitrary by changing the device width.

SUMMARY

Embodiments of the present invention address the above mentioned concerns by providing a differentially-recessed-contacted multi-gate SRAM cell, for example, to introduce the feasibility to design a cell with arbitrary beta ratio. According to an embodiment of the present invention, the parasitic resistance and drive current may be adjusted by incorporating recessed contacts at any desired transistors in the SRAM thereby optimizing the beta ratio to achieve higher stability.

According to one embodiment of the present invention, a complementary metal-oxide-semiconductor static random access memory (SRAM) cell is provided. The SRAM cell includes a plurality of N-channel multi-gate transistors and a plurality of P-channel multi-gate transistors. Each transistor includes a gate electrode and source and drain regions separated by the at least one gate electrode. The SRAM cell further includes a plurality of contacts formed within the source and drain regions of at least one transistor. The plurality of contacts are recessed a predetermined recess amount, wherein a resistance of the at least one transistor is varied based upon the predetermined recess amount.

According to another embodiment of the present invention, a method of forming recessed contacts within a complementary metal-oxide-semiconductor SRAM cell is provided. The method includes forming the complementary metal-oxide-semiconductor static random access memory cell comprising a plurality of N-channel multi-gate transistors and a plurality of P-channel multi-gate transistors, and masking a source and drain region of at least one respective transistor, recessing the source and drain region a predetermined recess amount and forming recessed contacts therein.

According to yet another embodiment of the present invention, a memory cell is provided. The memory cell includes a plurality of N-channel multi-gate transistors, and a plurality of P-channel multi-gate transistors. Each transistor includes a gate electrode and source and drain regions separated by the at least one gate electrode. The memory cell further includes a plurality of contacts formed within the source and drain regions of at least one transistor. The plurality of contacts are recessed a predetermined recess amount, wherein a resistance of the at least one transistor is varied based upon the predetermined recess amount.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

Embodiments of the present invention provide an SRAM cell including transistors (NFETs), for example, having recessed contacts which are recessed a predetermined recess amount. The resistance and drive current at the NFETs (pull-down devices or access transistors) may be adjusted depending on the predetermined recess amount of the recessed contacts. Therefore, an arbitrary beta ratio may be achieved. According to an embodiment of the present invention, the same concept can be applied to a P-channel (PFET) device to optimize the write stability.

Figure 1:
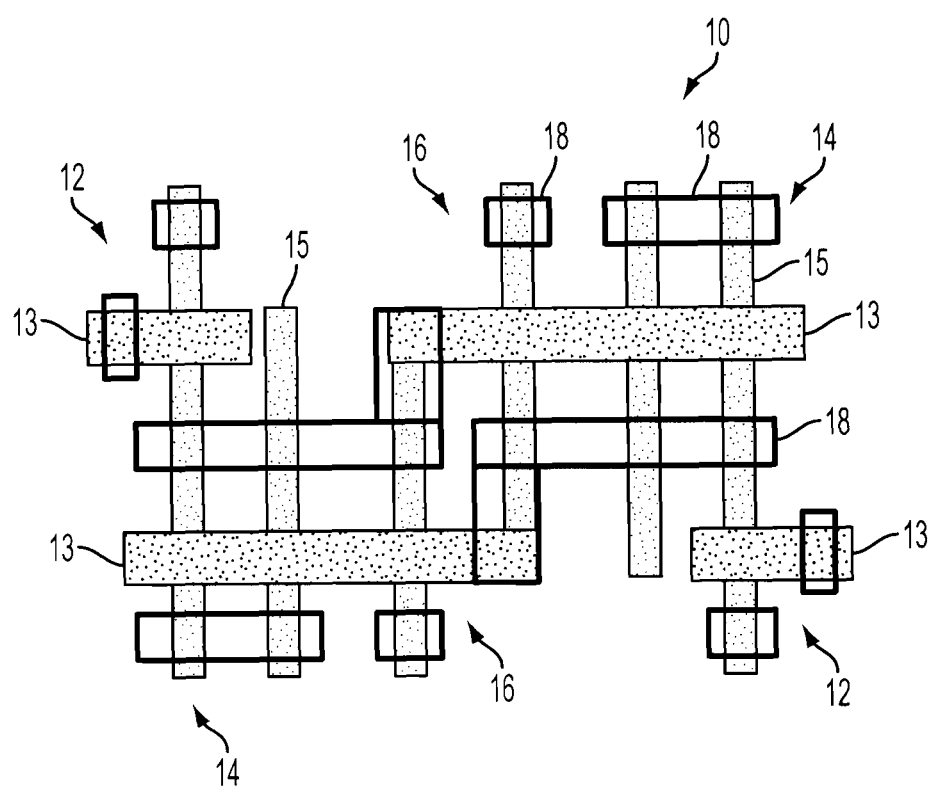
FIG. 1 is a layout view of a conventional SRAM cell.
Figure 2:
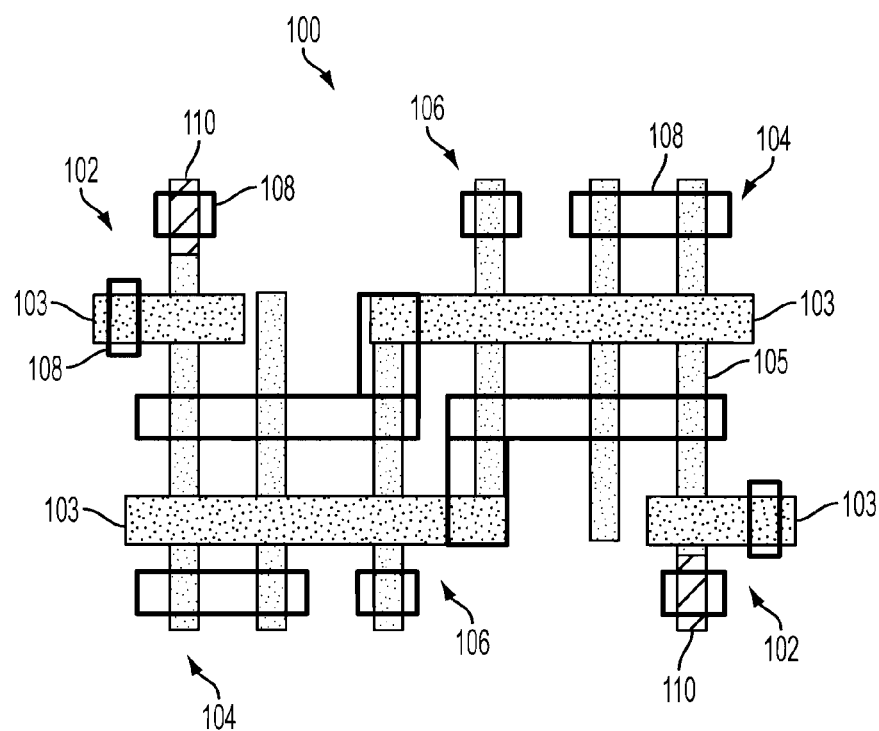
FIG. 2 is a layout view of an SRAM cell that can be implemented within embodiments of the present invention.

FIG. 2 is a layout view of an SRAM cell that can be implemented within embodiments of the present invention. As shown in FIG. 2, an SRAM cell 100 is provided. According to an embodiment of the present invention, the SRAM cell 100 is a complementary metal-oxide-semiconductor static random access memory (SRAM) cell. The SRAM cell 100 includes a plurality of N-channel multi-gate transistors 102, 104 and a plurality of P-channel multi-gate transistors 106. The SRAM cell 100 further includes a plurality of contacts 108 formed on at least one transistor 102, 104, 106. According to an embodiment of the present invention, the plurality of N-channel multi-gate transistors 102, 104 includes a plurality of access transistors 102 and a plurality of pull-down devices 104 and the plurality of P-channel multi-gate transistors 106 comprise pull-up devices 106. The N-channel multi-gate transistors 102 and 104 may include double-gate field effect transistors. The transistors 102, 104 and 106 further include at least one semiconductor fin 105. According to an embodiment of the present invention, at least two semiconductor fins 105 may be formed in parallel of a same width, for example, as shown at the pull-down devices 104 of the SRAM 100. The semiconductor fins 105 may comprise silicon, SiGe, SiC or any other semiconductor material.

Figure 3:
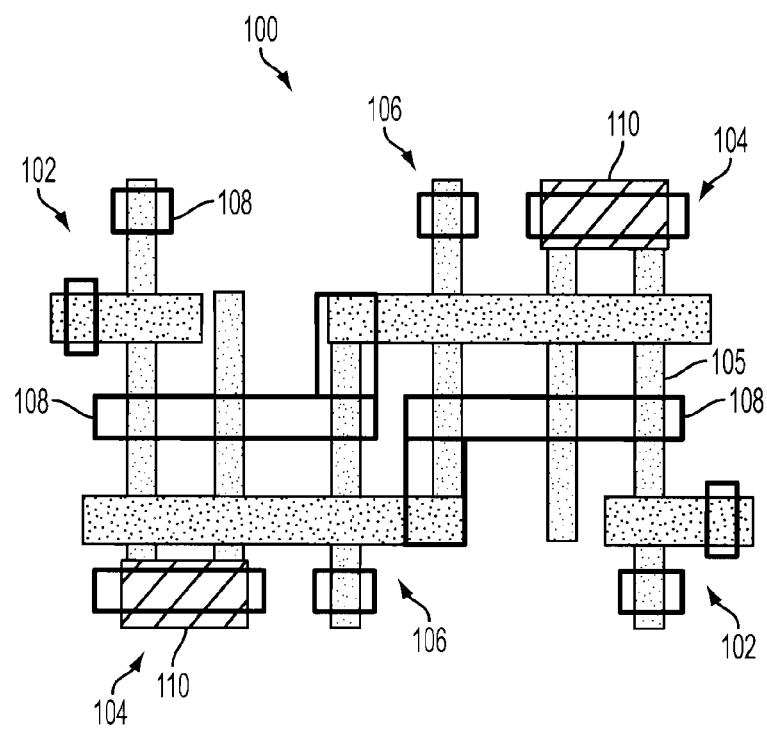
FIG. 3 is a layout view of an SRAM cell that can be implemented within alternative embodiments of the present invention.

According to an embodiment of the present invention, the plurality of contacts 108 may be recessed a predetermined recess amount for at least one of the transistors 102 or 104, for example, wherein a resistance of the at least one transistor 102 or 104 is varied based upon the predetermined recess amount. In FIG. 2, according to an embodiment of the present invention, the contacts 108 at the access transistors 102 are recessed a predetermined recess amount by performing a masking technique using a recess mask 110. By recessing the contacts at the access transistors 102 a predetermined recess amount, the resistance increases and the drive current increases, thereby the beta ratio of the SRAM cell 100 decreases to approximately 1.6. Alternatively, in FIG. 3, according to another embodiment of the present invention, the contacts 108 of the pull-down devices 104 are recessed a predetermined recess amount. Therefore, the resistance at the pull-down devices 104 is reduced, the drive current increases, and the beta ratio is increased to approximately 2.8. Thus, according to the embodiments of the present invention as shown in FIGS. 2 and 3, the arbitrary beta ratios may be realized. Additional elements of the transistors 102, 104, 106 will be discussed below with reference to FIGS. 4A and 4B.

Also, the differences between the contact resistances and the recess thickness of the contacts of the transistors will now be discussed below with reference to FIGS. 4A and 4B.

Figure 4A:
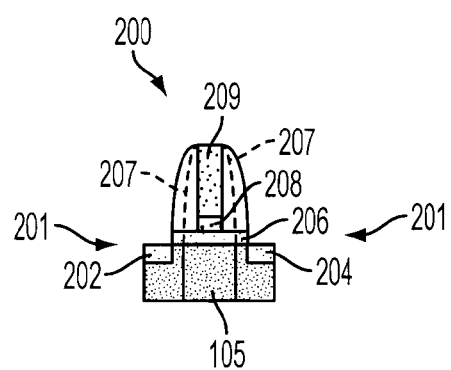
FIGS. 4A and 4B are cross sectional views of transistors having recessed contacts of an SRAM cell that can be implemented within embodiments of the present invention.
Figure 4B:
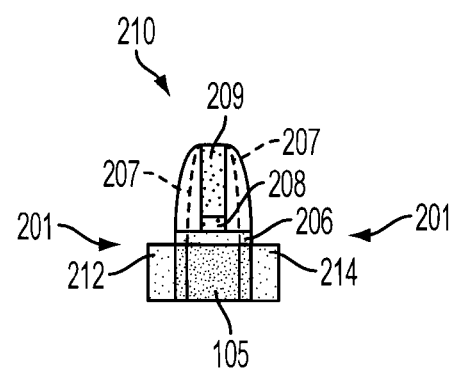

As shown in FIGS. 4A and 4B, the P-channel and N-channel multi-gate transistors 102, 104 and 106 each include at least one semiconductor fin 105 formed vertically on a substrate (not shown). Further, source and drain regions 201 are provided at each transistor 200 and 210. A plurality of contacts 202, 204, 212 and 214 are formed at the transistors 200 and 210 in the source and drain regions 201, respectively. A gate dielectric layer 206 is provided overlying the at least one semiconductor fin 105 and a gate electrode 208 is formed on the gate dielectric layer 206. According to an embodiment of the present invention, the gate dielectric layer 206 may be formed of silicon oxide, for example.

According to an embodiment of the present invention, a recess is formed at the source and drain regions 201 using a recess mask 110 (as depicted in FIGS. 2 and 3), the recess is then filled with silicide, for example, to form the contacts 202, 204, 212, 214.

A plurality of dielectric spacers 207 may also be provided at sidewalls of the gate electrode 208. A masking layer 209 is formed over the gate electrode 208. The masking layer 209 may be formed of a nitride layer such as silicon nitride or a photo resist layer, for example. As mentioned, the contact resistance may be varied based upon the predetermined recess amount of the recessed contacts. Additional information will be discussed below with reference to FIG. 5.

Figure 5:
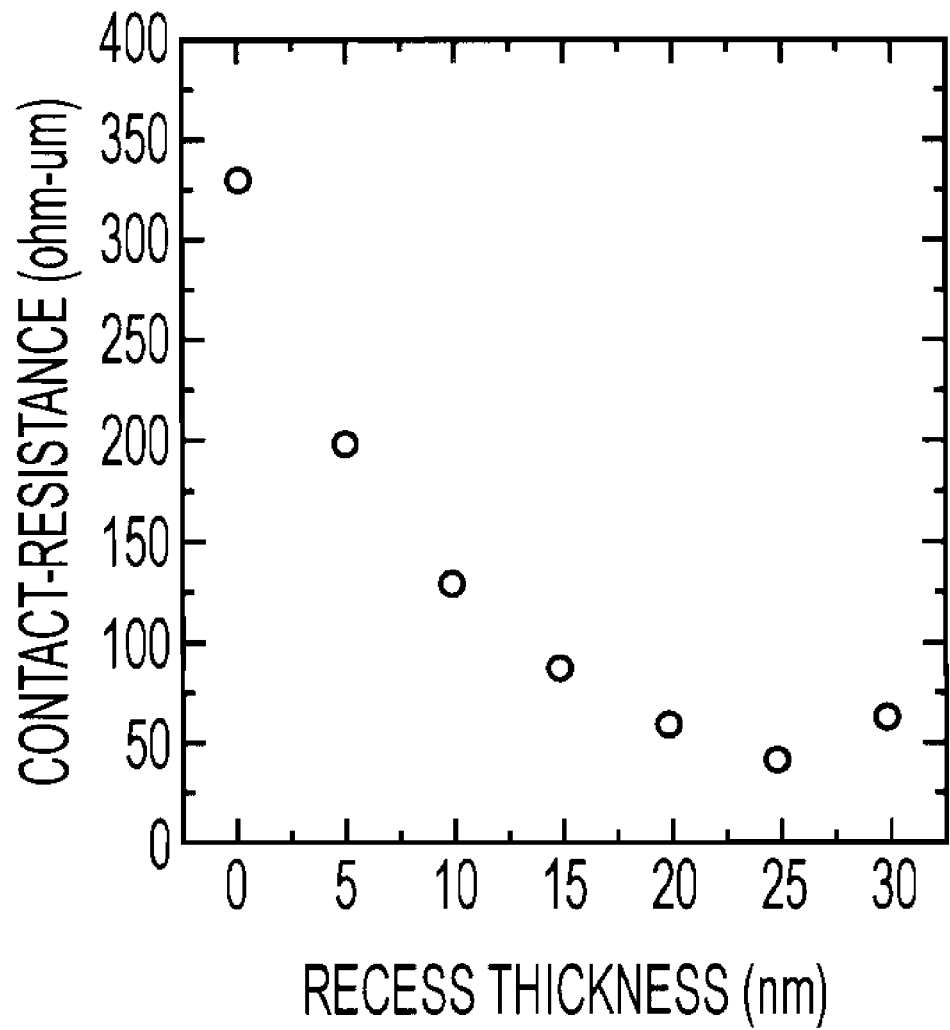
FIG. 5 is a graph illustrating contact resistance versus recess thickness of the contacts with reference to the transistors shown in FIGS. 4A and 4B that can be implemented within embodiments of the present invention.

FIG. 5 is a graph illustrating contact resistance versus recess thickness of the contacts with reference to the transistors shown in FIGS. 4A and 4B that can be implemented within embodiments of the present invention. As shown in FIGS. 4A and 4B, transistors 200 and 210 of an SRAM cell is provided. The transistors 200 and 210 each include a plurality of recessed contacts 202, 204, 212 and 214, respectively. The recessed contacts are formed within a semiconductor fin 105 of the transistor 200, 210. As discussed above, according to embodiments of the present invention, the transistor 200, 210 may be a pull-down transistor or an access transistor, for example. The contacts 202, 204, 212 and 214 are recessed a predetermined recess amount which directly affects the contact resistance thereof (as depicted in FIG. 5). According to an embodiment of the present invention, the predetermined recess amount of a contact of a desired transistor 200, 210 may range from approximately 0.1 nanometers (nm) to approximately a height of the semiconductor fin 105. According to an embodiment of the present invention, the predetermined recess amount for contacts 202 and 204 of transistor 200 of FIG. 4A is approximately 10 nanometers (nm), for example. Therefore, the contact resistance is approximately 135 ohm-um. The predetermined recess amount for contacts 212 and 214 of the transistor 210 is approximately 30 nanometers (nm) which is equal to the height of the semiconductor fin 105. Therefore, the contact resistance is approximately 60 ohm-um. Thus, according to an embodiment of the present invention, the contact resistance is varied based upon the recess thickness of the contacts of a respective transistor of the SRAM cell. Since, the contact resistance is varied, the drive current of the transistor may be adjusted and therefore, an arbitrary beta ratio of the SRAM cell may be realized.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A complementary metal-oxide-semiconductor static random access memory (SRAM) cell comprising:
   a plurality of N-channel multi-gate transistors, including a pair of pull-down devices and a pair of access transistors, and a plurality of P-channel multi-gate transistors including a pair of pull-up devices, each comprising:
   a gate electrode and source and drain regions separated by the at least one gate electrode; and
   a plurality of contacts formed within the source and drain regions of at least one transistor, wherein the plurality of contacts for only the pair of access transistors are selectively recessed a predetermined recess amount, wherein a resistance of the access transistors increases based upon the predetermined recess amount so as to increase a drive current of the access transistors and thereby decrease a beta ratio of the SRAM cell in comparison to that of an SRAM cell without recessed contacts.

2. The complementary metal-oxide-semiconductor static random access memory cell of claim 1, wherein the N-channel multi-gate transistors comprise double-gate field effect transistors.

3. The complementary metal-oxide-semiconductor static random access memory cell of claim 1, wherein the P-channel and N-channel multi-gate transistors each comprise:
   at least one semiconductor fin formed vertically on a substrate;
   a gate dielectric layer overlying the at least one semiconductor fin; and
   the gate electrode formed on the gate dielectric layer.

4. The complementary metal-oxide-semiconductor static random access memory cell of claim 3, wherein the at least one semiconductor fin includes at least two semiconductor fins in parallel of a same width.

5. The complementary metal-oxide-semiconductor static random access memory cell of claim 3, wherein the at least one semiconductor fin comprises silicon and the contacts comprises silicide.

6. The complementary metal-oxide-semiconductor static random access memory cell of claim 3, wherein the predetermined recessed amount ranges between approximately 0.1 nanometer (nm) to approximately a height of the semiconductor fin.

7. A static random access memory (SRAM) memory cell comprising:
   a plurality of P-channel multi-gate transistors including a pair of pull-up devices, and a plurality of N-channel multi-gate transistors, including a pair of pull-down devices and a pair of access transistors, each comprising:
   a gate electrode and source and drain regions separated by the at least one gate electrode; and
   a plurality of contacts formed within the source and drain regions of at least one transistor, wherein the plurality of contacts for only the pair of pull down devices are selectively recessed a predetermined recess amount, wherein a resistance of the pull down devices increases based upon the predetermined recess amount so as to increase a drive current of the pull down transistors and thereby increase a beta ratio of the SRAM cell in comparison to that of an SRAM cell without recessed contacts.

8. The SRAM cell of claim 7, wherein the N-channel multi-gate transistors comprise double-gate field effect transistors.

9. The SRAM cell of claim 7, wherein the P-channel and N-channel multi-gate transistors each comprise:
   at least one semiconductor fin formed vertically on a substrate;
   a gate dielectric layer overlying the at least one semiconductor fin; and
   the gate electrode formed on the gate dielectric layer.

10. The SRAM cell of claim 9, wherein the at least one semiconductor fin includes at least two semiconductor fins in parallel of a same width.

11. The SRAM cell of claim 9, wherein the at least one semiconductor fin comprises silicon and the contacts comprises silicide.

12. The SRAM cell of claim 9, wherein the predetermined recessed amount ranges between approximately 0.1 nanometer (nm) to approximately a height of the semiconductor fin.

* * * * *